United States Patent [19]
Buck
[11] 4,207,547
[45] Jun. 10, 1980

[54] REFLECTION MODE NOTCH FILTER

[75] Inventor: Daniel C. Buck, Hanover, Md.
[73] Assignee: The United States of America as represented by the Secretary of the Air Force, Washington, D.C.

[21] Appl. No.: 956,705
[22] Filed: Nov. 1, 1978
[51] Int. Cl.² .......... H01P 1/20; H03H 7/14
[52] U.S. Cl. .......... 333/209; 328/167; 333/202
[58] Field of Search .......... 328/167; 333/134, 135, 333/156, 202, 208, 209

[56] References Cited

U.S. PATENT DOCUMENTS

| | | | |
|---|---|---|---|
| 3,423,699 | 1/1969 | Hines | 333/160 X |
| 3,538,460 | 11/1970 | Putz | 333/209 |
| 3,660,783 | 5/1972 | Cappucci | 333/202 X |
| 3,895,304 | 7/1975 | Klein | 328/167 |
| 3,967,220 | 6/1976 | Tagashira et al. | 333/28 R |

*Primary Examiner*—Eugene R. LaRoche
*Attorney, Agent, or Firm*—Joseph E. Rusz; Willard R. Matthews, Jr.

[57] ABSTRACT

A two stage transmission notch filter characteristic is achieved with one stage of microwave circuitry. Elimination of the second stage is accomplished by reflecting the microwave power back through a single stage device. Structurally, the adjacent ports of two 3 dB directional couplers are directly connected by delay lines of unequal delay times. The opposite adjacent ports of one coupler comprise the device input and output while the opposite adjacent ports of the other coupler are terminated in a manner that reflects microwave power back through the device. A phase shifter is inserted into one delay line for tuning and a non-reciprocal phase element is used to prevent reflected signals from emerging from the input port.

6 Claims, 7 Drawing Figures

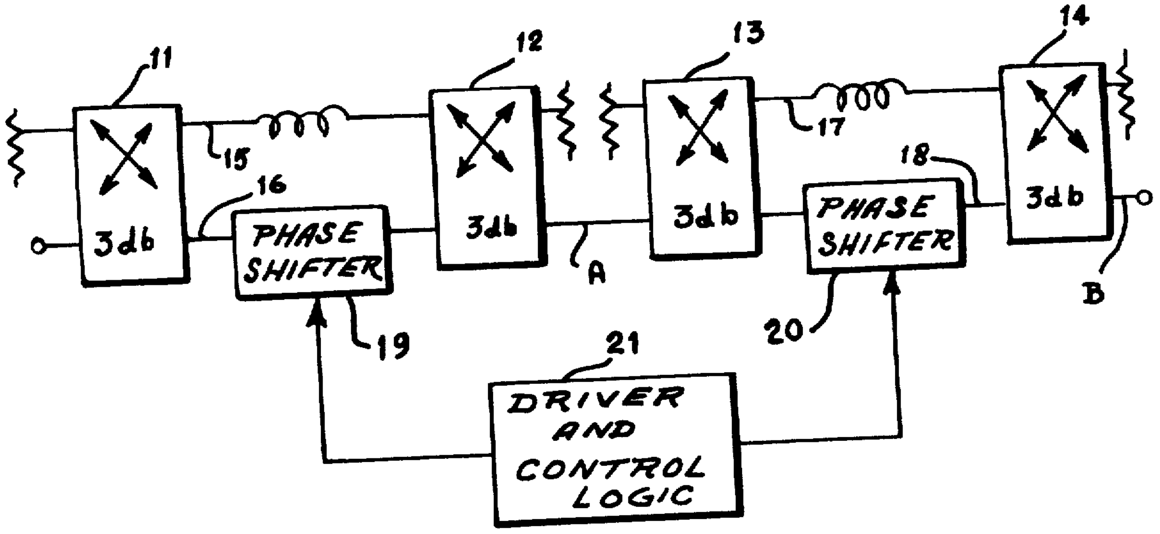
FIG. 1
PRIOR ART
FIG. 2
FIG. 4
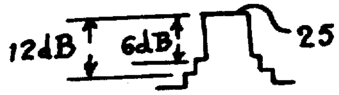
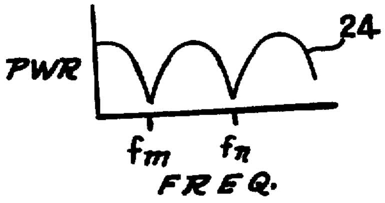
FIG. 3
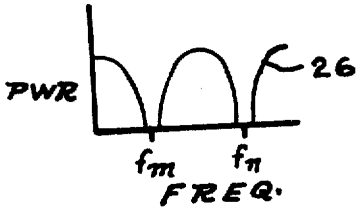
FIG. 5

REFLECTION MODE NOTCH FILTER

STATEMENT OF GOVERNMENT INTEREST

The invention described herein may be manufactured and used by or for the Government for governmental purposes without the payment of any royalty thereon.

BACKGROUND OF THE INVENTION

This invention relates to microwave filters and in particular to an improved tunable microwave notch filter.

In various radar systems interleaving series of pulses are used such that the series is made up of two or more pulse trains in which each pulse train has a common carrier frequency. It is then of interest to provide circuits in the radar transmitter which will eliminate, or "notch out" one carrier frequency when in the presence of another. Typically, these microwave carriers will differ by 10's of megahertz. Thus, use of conventional filter circuits is rendered difficult due to the very high Q factors and steep rolloffs needed. Also, if one or more of these carriers is desirable of adjustment, then the filters must also be adjustable, usually electronically. Finally, to eliminate interference, one typically seeks 50–60 or better isolation, along with fractional dB insertion loss to the transmitted signal.

These functions have recently been successfully provided by the device disclosed in U.S. Pat. No. 3,895,304 by G. I. Klein entitled TUNABLE MICROWAVE NOTICH FILTER. The Klein filter is comprised of two filter stages and tuning (for notch location) is accomplished by phase shifting in each stage. Although this notch filter represents a substantial improvement over prior art devices it is a component of substantial volume and complexity and the two filter stages must be precisely tuned to have their notches line up in the frequency domain. Accordingly, it is desirable that a reduction in size and complexity and the elimination of the necessity of the fine-tune phase notch of the two phase shifters in this type of filter be realized. The present invention is directed toward providing a notch filter that meets these requirements.

SUMMARY OF THE INVENTION

The invention is directed to a four port reflection mode notch filter for use in radar systems. A presently preferred embodiment comprises a pair of branch line couplers having 50 dB directivity and a pair of delay lines of unequal delay time. One of the delay lines includes a variable phase shifter for tuning purposes. Signals are reflected back through the filter which includes a nonreciprocal phase element comprising a circulator and a Schiffman line section coupled to one of the ports. The nonreciprocal phase element introduces a 90° nonreciprocal insertion phase which causes reflected signals to emerge from a port adjacent to the input port. The invention reduces the amount of hardware and the need for fine tuning of dual phase shifters required in prior art devices.

It is a principal object of the invention to provide a new and improved microwave notch filter.

It is another object of the invention to provide a tunable microwave notch filter that is smaller in size and less complex then currently available devices.

It is another object of the invention to provide a tunable microwave notch filter that eliminates the necessity of the fine-tune phase notch of the two phase shifters required in a Klein type notch filter.

These together with other objects, features and advantages of the invention will become more readily apparent from the following detailed description when taken in conjunction with the illustration embodiment in the accompanying drawings.

DESCRIPTION OF THE DRAWINGS

FIG. 1 is a block diagram of a prior art microwave notch filter;

FIG. 2 is a curve illustrating the time domain db transfer characteristic appearing after the first stage of the filter of FIG. 1;

FIG. 3 is a curve illustrating the frequency domain db transfer characteristic appearing after the first stage of the filter of FIG. 1;

FIG. 4 is a curve illustrating the time domain db transfer characteristic appearing at the output of the filter of FIG. 1;

FIG. 5 is a curve illustrating the frequency domain db transfer characteristic appearing at the output of the filter of FIG. 1;

DETAILED DESCRIPTION OF THE PREFERRED EMBODIMENT

Figure 6:
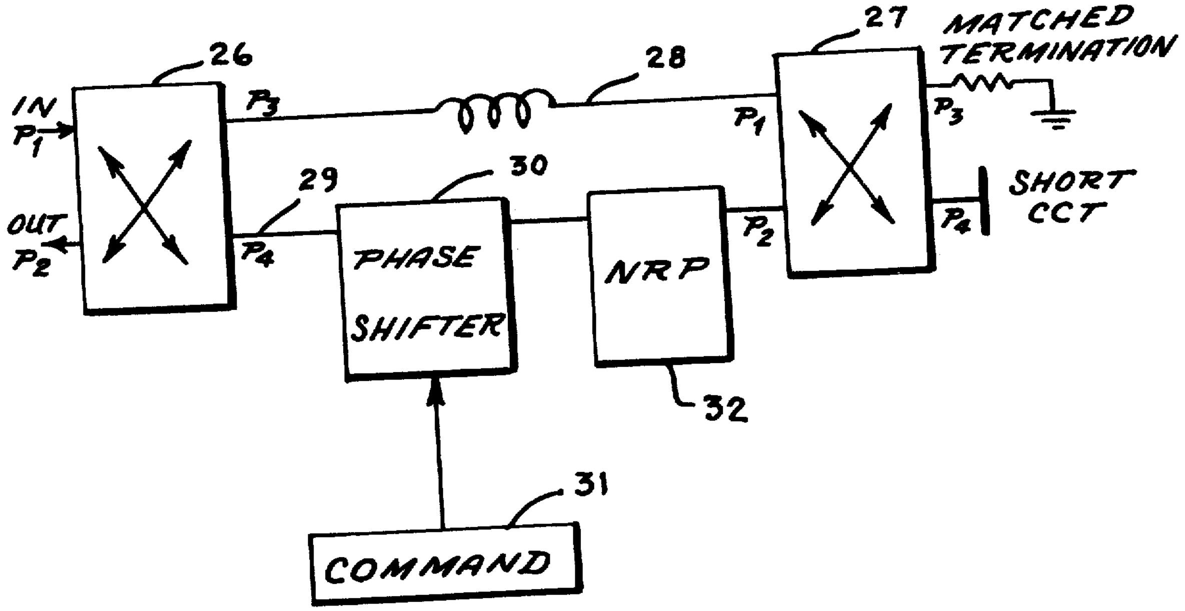
FIG. 6 is a block diagram of one presently preferred embodiment of the invention.

A prior art type notch filter, specifically the tunable microwave notch filter disclosed by the Klein patent is illustrated by FIG. 1. It comprises 3 db couplers 11, 12, 13, 14, delay lines 15, 16, 17, 18, phase shifters 19, 20 and drive control logic circuit 21.

It can be seen that the notch filter is made up of two stages, each of which comprises a pair of 3 dB couplers (11, 12 and 13, 14) and a pair of delay lines (15, 16 and 17, 18) of unequal delay times. The differential delay time of these lines determines the location of the notch. The "notched" frequency, at which zero transmission coefficient occurs, differs from the transmitted frequency by $$\Delta f = f_{trans} - f_{notch} = (1.5\times 10^4/\Delta L(\text{cm}))\ \text{MHZ}.$$

ΔL is the difference in line lengths in cm, and an air dielectric is assumed. Correction for other than air dielectric is known art.

To make the filter tunable, one of the two lines is made variable in length by means of a phase shifter. In effect, ΔL can be changed upon imposition of an electronic command. In the device described in the above-mentioned patent, the phase shifter is of the ferrite type, and has a nonreciprocal insertion phase. Each state of the filter has a transmission characteristic given by $$V_{out}/V_{in} = (A + B\cos\phi)^2$$

where A and B are essentially proportional to the two delay line losses, and $\phi$ is the phase difference between the two lines, and including the effects of the couplers, if any. To achieve a two stage response $$V_{out}/V_{in} = (A - B\cos\phi)^2$$

two stages are cascaded, as shown in FIG. 1. The dB transfer characteristics in the time and frequency domains are shown in FIGS. 2-5. Curve 23 of FIG. 2 and curve 24 of FIG. 3 are respectively the time domain and the frequency domain characteristics appearing at point A of the circuit of FIG. 1. Curve 25 of FIG. 4 and curve 26 of FIG. 5 are respectively the time domain and frequency domain characteristics appearing at point B.

FIGS. 2-5 show that the two filters must be very precisely tuned to have their notches line up in the frequency domain. This is done by fine tuning the individual phase shifters 19, 20 unless their phase vs. control voltage characteristics can be made identical to within about ±1°.

The present invention comprehends a modification of the above described notch filter that can at the same time greatly reduce the volume and complexity of the device and also eliminate the necessity of the fine-tune phase notch of the two phase shifters. This is shown by the block diagram of FIG. 6. Referring to FIG. 6 the notch filter of the invention comprises power dividers (or directional couplers) 26, 27, delay lines 28, 29, phase shifter 30, command control circuit 31, and nonreciprocal phase element (NRP) 32. The directional coupler is a waveguide network of four guide terminals or ports, P1, P2, P3, P4 such that there is complete isolation between P1 and P2 and between P3 and P4 but no isolation between the two terminals of any other combination. Types of couplers suitable to use in the present invention one identified in the Klein patent cited above. Terminals P1 and P2 of directional coupler 26 are utilized as an input and an output of the device. Terminal P3 of directional coupler 27 is terminated in a matched termination and terminal P4 is short circuited. The remaining terminals are connected by delay lines 28 and 29 in the manner shown. Delay lines 28, 29 are of unequal delay time the difference of which is based on the same considerations detailed in the Klein patent.

In essence, the device has been reflected back on itself, and one component, the Non-Reciprocal Phase element 32 has been added. The purpose of the NRP is to cause the reflected or output signal to emerge from port P2 instead of port P1 by introducing a 90° nonreciprocal insertion phase. In practice, both the electronic phase shifter 30 and the NRP 32 must have their phase parameters held to about 1° over a desired operating band to achieve a notch depth of 50 dB.

The critical elements in the assembly are the two directional couplers. In order to get the deep notch depths, 50 dB directivity should be obtained with both couplers. This can readily be accomplished with multisigment coupler designs such as branch line couplers. 50 dB directivity has been achieved with a Ka band waveguide multihole coupler by careful tuning. The tolerance problem would be similar to middle range microwave frequency circuits in stripline.

Figure 7:
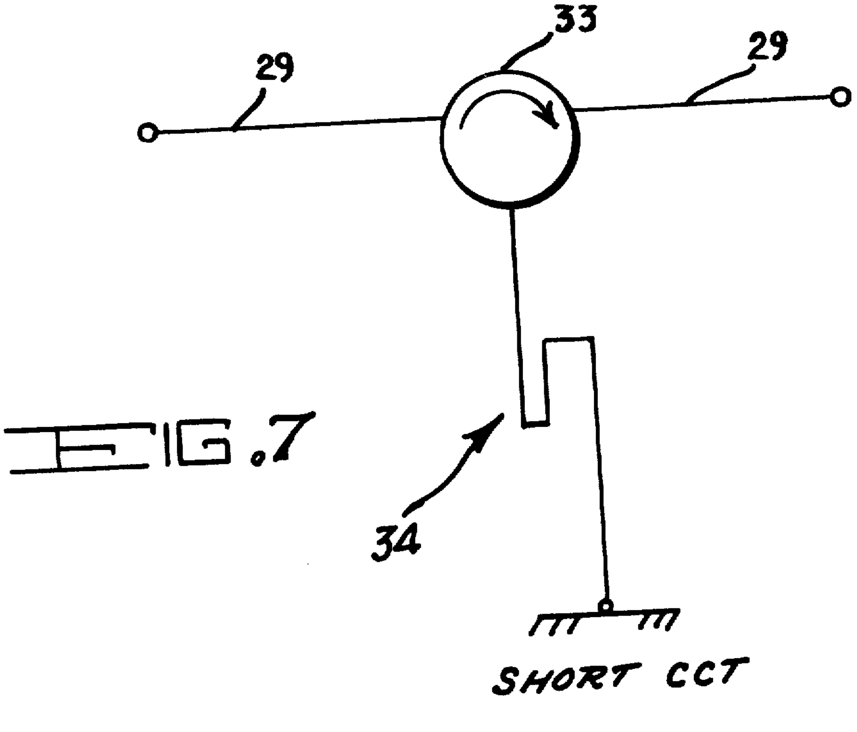
FIG. 7 is a schematic diagram of the non-reciprocal phase element of the device of FIG. 6.

FIG. 7 illustrates a nonreciprocal phase element that can be used in the invention. It comprises a three port circulator 33 with its third port terminated in a Schiffman line section 34. The Schiffman device is described in the publication *A New Class of Broad-band Microwave 90-degree Phase Shifter*, IRE Transaction on Microwave Theory and Technique, Vol. MTT-6 pp 232-237, April 1958. The circuit of FIG. 7 has the feature that its insertion phase differs from that of a non dispersive transmission line segment by a constant over fairly wide frequency bands, thus the NRP can be adjusted to give 90° nonreciprocal insertion phase over a band.

While the invention has been described in its preferred embodiment it is understood that the words which have been used are words of description rather than words of limitation and that changes within the purview of the appended claims may be made without departing from the scope and spirit of the invention in its broader aspects.

What is claimed is:

1. A reflection mode notch filter comprising first and second four terminal electromagnetic wave power dividers, first and second delay lines and a nonreciprocal phase element, the first and the second adjacent mutually isolated terminals of said first power divider comprising an input and an output respectively, the third and fourth adjacent mutually isolated terminals thereof being connected respectively to first and second adjacent mutually isolated terminals of said second power divider by said first and second delay lines, the third and fourth adjacent mutually isolated terminals of said second power divider being terminated to reflect received electromagnetic wave energy back to said first power divider, and said nonreciprocal phase element being connected into said second delay line.

2. A reflection mode notch filter as defined in claim 1 including variable phase shift means in said second delay line.

3. A reflection mode notch filter as defined in claim 2 wherein said first and second four terminal electromagnetic wave power dividers are 3 dB directional couplers.

4. A reflection mode notch filter as defined in claim 3 wherein said first and second delay lines have unequal delay times, the differential delay time thereof being a function of the filter notch location.

5. A reflection mode notch filter as defined in claim 4 wherein said non-reciprocal phase element comprises a three port circulator having its third port terminated in a Schiffman line section.

6. A reflection mode notch filter as defined in claim 5 wherein the third and fourth terminals of said second power divider are terminated in a matched termination and a short circuit respectively.

* * * * *